United States Patent
Goldrin et al.

(10) Patent No.: US 12,022,586 B2
(45) Date of Patent: Jun. 25, 2024

(54) ASSEMBLY OF ELECTRONIC SEMICONDUCTOR COMPONENTS AND METHOD FOR OPERATING AN ASSEMBLY OF ELECTRONIC SEMICONDUCTOR COMPONENTS

(71) Applicant: OSRAM Opto Semiconductors GmbH, Regensburg (DE)

(72) Inventors: Victor Goldrin, Regensburg (DE); Stefan Grötsch, Bad Abbach (DE)

(73) Assignee: OSRAM Opto Semiconductors GmbH, Regensburg (DE)

( * ) Notice: Subject to any disclaimer, the term of this patent is extended or adjusted under 35 U.S.C. 154(b) by 297 days.

(21) Appl. No.: 17/625,647

(22) PCT Filed: Jul. 8, 2020

(86) PCT No.: PCT/EP2020/069279
§ 371 (c)(1),
(2) Date: Jan. 7, 2022

(87) PCT Pub. No.: WO2021/005121
PCT Pub. Date: Jan. 14, 2021

(65) Prior Publication Data
US 2022/0272811 A1   Aug. 25, 2022

(30) Foreign Application Priority Data
Jul. 9, 2019   (DE) .................... 10 2019 118 543.2

(51) Int. Cl.
*H05B 45/3725*   (2020.01)
*F21K 9/90*   (2016.01)
(Continued)

(52) U.S. Cl.
CPC ........... *H05B 45/3725* (2020.01); *F21K 9/90* (2013.01); *F21V 23/003* (2013.01); *F21V 23/02* (2013.01);
(Continued)

(58) Field of Classification Search
None
See application file for complete search history.

(56) References Cited

U.S. PATENT DOCUMENTS 9,425,769 B1 * 8/2016 White ................... H01Q 15/008
9,524,809 B1 * 12/2016 Boulais ................... C09D 11/10
(Continued)

FOREIGN PATENT DOCUMENTS

CN   2407526 Y   11/2000
GB   2528250 A   1/2016

OTHER PUBLICATIONS

International Search Report issued for corresponding International Patent Application No. PCT/EP2020/069279 dated Oct. 16, 2020, along with an English translation.
(Continued)

*Primary Examiner* — Srinivas Sathiraju
(74) *Attorney, Agent, or Firm* — HAUPTMAN HAM, LLP

(57) ABSTRACT

An assembly of electronic semiconductor components includes a carrier, at least one optoelectronic semiconductor component, a varactor component and a receiving element. The optoelectronic semiconductor component, the varactor component and the receiving element are arranged on the carrier. The optoelectronic semiconductor component and the varactor component are formed with the same semiconductor material. The optoelectronic semiconductor component has an active region configured for emitting electromagnetic radiation. The varactor component together with
(Continued)

Figure 1:
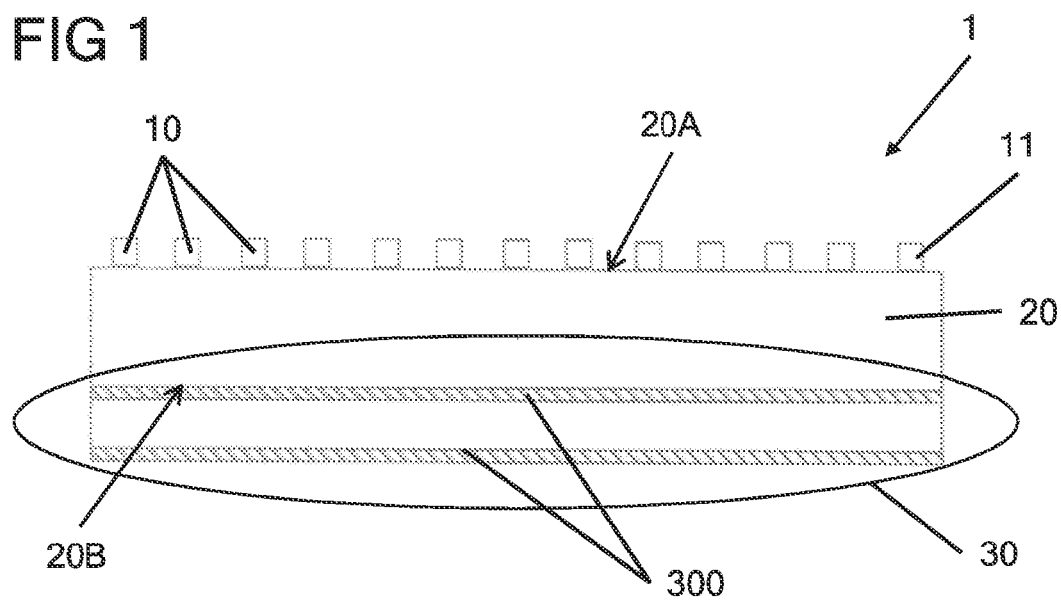

the receiving element forms a tunable resonant circuit. The resonant circuit is configured to draw energy for operating the optoelectronic semiconductor component from an alternating electromagnetic field.

9 Claims, 2 Drawing Sheets

(51) Int. Cl.
　　　*F21V 23/00*　　　(2015.01)
　　　*F21V 23/02*　　　(2006.01)
　　　*F21V 23/04*　　　(2006.01)
　　　*F21Y 113/13*　　(2016.01)
　　　*F21Y 115/10*　　(2016.01)
(52) U.S. Cl.
　　　CPC ......... *F21V 23/045* (2013.01); *F21Y 2113/13* (2016.08); *F21Y 2115/10* (2016.08)

(56) References Cited

U.S. PATENT DOCUMENTS

| | | | | |
|---|---|---|---|---|
| 9,723,699 | B1* | 8/2017 | Von Novak, III | H02J 50/12 |
| 9,753,185 | B2* | 9/2017 | Boulais | H01L 31/09 |
| 10,346,734 | B2* | 7/2019 | Jesme | G01K 7/00 |
| 11,739,891 | B2* | 8/2023 | Kunz | F21K 9/69 |
| | | | | 362/555 |
| 2004/0239243 | A1* | 12/2004 | Roberts | B60Q 1/2696 |
| | | | | 257/E25.02 |
| 2006/0012000 | A1* | 1/2006 | Estes | H10N 60/10 |
| | | | | 257/E29.241 |
| 2009/0250517 | A1* | 10/2009 | Brandin | G06K 19/07703 |
| | | | | 235/439 |
| 2010/0259110 | A1* | 10/2010 | Kurs | B60L 53/665 |
| | | | | 307/104 |
| 2015/0270719 | A1* | 9/2015 | Kurs | H02J 50/70 |
| | | | | 320/108 |
| 2016/0190410 | A1* | 6/2016 | Kromotis | H01L 33/56 |
| | | | | 438/26 |
| 2016/0218249 | A1* | 7/2016 | Ninz | H01L 23/544 |
| 2016/0225749 | A1* | 8/2016 | Leirer | H01L 33/483 |
| 2016/0233200 | A1* | 8/2016 | Pindl | H01L 33/54 |
| 2016/0240734 | A1* | 8/2016 | Avramescu | H01L 33/32 |
| 2016/0240747 | A1* | 8/2016 | Pindl | H01L 33/483 |
| 2016/0240756 | A1* | 8/2016 | Zitzlsperger | H01L 33/486 |
| 2016/0247990 | A1* | 8/2016 | Scholz | H01L 25/167 |
| 2016/0276531 | A1* | 9/2016 | Ebbecke | H01L 33/0062 |
| 2016/0276534 | A1* | 9/2016 | Sundgren | H01L 33/0066 |
| 2016/0276545 | A1* | 9/2016 | Mueller | H01L 24/24 |
| 2017/0075038 | A1* | 3/2017 | Boulais | G02B 6/0043 |
| 2017/0354326 | A1* | 12/2017 | Pugh | A61B 5/398 |
| 2018/0144227 | A1* | 5/2018 | Jesme | G06K 19/07773 |
| 2019/0026618 | A1* | 1/2019 | Jesme | G06K 19/0773 |
| 2019/0195466 | A1* | 6/2019 | Shimizu | F21V 9/30 |
| 2021/0366979 | A1* | 11/2021 | Robin | H01L 33/50 |
| 2022/0178503 | A1* | 6/2022 | Kunz | F21K 9/69 |
| 2022/0272811 | A1* | 8/2022 | Goldrin | H05B 45/3725 |
| 2023/0358373 | A1* | 11/2023 | Kunz | F21S 41/663 |

OTHER PUBLICATIONS

Written Opinion issued for corresponding International Patent Application No. PCT/EP2020/069279 dated Oct. 16, 2020.
Marso et al., "AlGaN/GaN varactor diode for integration in HEMT circuits", Electronics Letters, vol. 37, No. 24, Nov. 22, 2001, pp. 1476-1478.

* cited by examiner

ASSEMBLY OF ELECTRONIC SEMICONDUCTOR COMPONENTS AND METHOD FOR OPERATING AN ASSEMBLY OF ELECTRONIC SEMICONDUCTOR COMPONENTS

CROSS REFERENCE TO RELATED APPLICATION

This application is a National Stage of International Application No. PCT/EP2020/069279, filed on Jul. 8, 2020, which designates the United States and was published in Europe, and which claims priority to German Patent Application No. 10 2019 118 543.2, filed on Jul. 9, 2019, in the German Patent Office. Both of the aforementioned applications are hereby incorporated by reference in their entireties.

An assembly of electronic semiconductor components and a method for operating an assembly of electronic semiconductor components are specified. The assembly of electronic semiconductor components forms for example a lighting module that emits electromagnetic radiation for lighting purposes.

The assembly of electronic semiconductor components can serve for example for interior lighting in an automobile or for use in textiles, for example garments.

One object to be achieved consists in specifying an assembly of electronic semiconductor components which can be supplied with energy wirelessly.

A further object to be achieved consists in specifying a method for operating an assembly of electronic semiconductor components which enables efficient operation over variable distances from an alternating electromagnetic field.

In accordance with at least one embodiment of the assembly of electronic semiconductor components, the assembly comprises a carrier. The carrier is in particular a printed circuit board (designated as: PCB). The carrier can be a mechanically supporting component of the assembly. In particular, the carrier serves for mechanically securing electronic semiconductor components. Preferably, the carrier is formed with an electrically insulating material, to which an electrically conductive material can be applied in a simple manner. By way of example, the carrier is formed with a fiber-reinforced synthetic resin.

In accordance with at least one embodiment of the assembly of electronic semiconductor components, the assembly comprises at least one optoelectronic semiconductor component. The optoelectronic semiconductor component is arranged on the carrier and has an active region configured for emitting electromagnetic radiation. The optoelectronic semiconductor component is in particular a radiation-emitting optoelectronic semiconductor component that emits electromagnetic radiation, for example light, during operation.

The active region comprises a pn junction, a double heterostructure, preferably a single quantum well (SQW) structure or a multi quantum well (MQW) structure for generating radiation.

In accordance with at least one embodiment of the assembly of electronic semiconductor components, the assembly comprises a varactor component arranged on the carrier. A varactor component includes a component part having a voltage-controlled capacitance. By way of example, the capacitance of the varactor component is dependent on a DC voltage present at the varactor component. Advantageously, a varactor component thus requires no mechanically movable parts at all in order to attain a change in the capacitance. A varactor component can be realized by a diode operated in the reverse direction. Advantageously, the active region of the varactor component has a suitable doping profile in order to amplify the voltage dependence of the capacitance.

In accordance with at least one embodiment of the assembly of electronic semiconductor components, the assembly comprises a receiving element. The receiving element is preferably arranged on the carrier. By way of example, the receiving element comprises an inductance. An alternating electromagnetic field can induce a voltage in an inductance.

In accordance with at least one embodiment of the assembly of electronic semiconductor components, the varactor component together with the receiving element forms a tunable resonant circuit. A resonant circuit comprises an inductance and a capacitance formed at least partly by the varactor component, said inductance and capacitance both being connected in series or in parallel with one another. A resonant circuit has a resonant frequency that is dependent on the size of the inductance and the capacitance. The resonant frequency can be varied inter alia by way of a variation of the capacitance and thus by means of the varactor component.

A resonant circuit having a variable resonant frequency is tunable to a desired frequency. If a resonant circuit is coupled to an alternating electromagnetic field by means of inductive coupling, the coupling factor is dependent on the resonant frequency of the resonant circuit, inter alia. A tunable resonant circuit can thus vary its coupling factor with respect to an alternating field with a constant frequency. A coupling factor that is as high as possible arises if the resonant frequency of the resonant circuit corresponds to the frequency of the alternating field.

In accordance with at least one embodiment of the assembly of electronic semiconductor components, the resonant circuit is configured to draw energy for operating the optoelectronic semiconductor component from an alternating electromagnetic field. The resonant circuit is dimensioned in such a way that it can draw a sufficient amount of energy from an alternating field in order thus to operate at least one optoelectronic semiconductor component.

In accordance with at least one embodiment of the assembly of electronic semiconductor components, the assembly comprises
a carrier,
at least one optoelectronic semiconductor component, a varactor component and a receiving element, wherein
the optoelectronic semiconductor component (10), the varactor component (11) and the receiving element (30) are arranged on the carrier (20),
the optoelectronic semiconductor component has an active region configured for emitting electromagnetic radiation,
the varactor component together with the receiving element forms a tunable resonant circuit, and
the resonant circuit is configured to draw energy for operating the optoelectronic semiconductor component from an alternating electromagnetic field.

An assembly of electronic semiconductor components that is described here is based on the following considerations, inter alia: during operation of a plurality of mutually spaced apart assemblies of electronic semiconductor components by means of inductive coupling by way of a single alternating electromagnetic field, different coupling factors can arise depending on the distance from the starting point of the alternating field. The different coupling factors can result for example in undesired variations in the brightness of the optoelectronic semiconductor components operated by means of the resonant circuits.

The assembly of electronic semiconductor components that is described here makes use of the concept, inter alia, of making the coupling factor of assemblies with an alternating field variable by means of a tunable resonant circuit. The variation of the coupling factor advantageously makes it possible to ensure that power is drawn uniformly from the electromagnetic transmission field for all assemblies. A tunable resonant circuit can be realized with the aid of an adjustable capacitance formed at least partly with the varactor component. By way of example, a reverse-biased diode is suitable as varactor component. In particular, the latter can also be a reverse-biased light-emitting diode. This enables an adjustable coupling factor of a plurality of assemblies of electronic semiconductor components and at the same time simple production, since a specific varactor diode is not necessarily required.

In accordance with at least one embodiment of the assembly of electronic semiconductor components, the optoelectronic semiconductor component and the varactor component are arranged on a first side of the carrier, and the receiving element is arranged on a second side of the carrier, said second side being situated opposite the first side. Such a configuration enables electromagnetic radiation to be emitted from the optoelectronic semiconductor component with as little impediment as possible. Furthermore, the arrangement of the receiving element on the second side of the carrier simplifies the contacting of the receiving element.

In accordance with at least one embodiment of the assembly of electronic semiconductor components, the receiving element comprises a coil having at least one turn. Advantageously, individual turns can be arranged in individual layers of the carrier and can be connected to one another by means of through contacts. The length of the coil, the number of its turns and also the geometry of the coil influence the inductance of the coil. By way of example, the turns of the coil are embodied as circular conductor tracks which furthermore can be arranged in different layers of the carrier.

In accordance with at least one embodiment of the assembly of electronic semiconductor components, the electronic semiconductor component and the varactor component are formed with the same semiconductor material. Preferably, the optoelectronic semiconductor components and the varactor component are produced in a common method step. This advantageously enables simple and cost-effective production of a varactor component on the basis of an optoelectronic semiconductor component. By way of example, the optoelectronic semiconductor component and the varactor component are formed with a gallium nitride semiconductor component.

In accordance with at least one embodiment of the assembly of electronic semiconductor components, the assembly has an integrated circuit comprising an interface for wireless communication. The integrated circuit can for example include an interface for Bluetooth or Zigbee communication and thus be drivable wirelessly. The integrated circuit can for example provide for switching optoelectronic semiconductor components on and off and/or for selecting a desired light color by mixing of different optoelectronic semiconductor components.

In accordance with at least one embodiment of the assembly of electronic semiconductor components, the assembly has an electrical energy storage unit between the resonant circuit and the integrated circuit. The electrical energy storage unit can comprise a capacitance or a rechargeable battery, for example. The energy storage unit advantageously enables the assembly of electronic semiconductor components to be operated autonomously at least at times. An assembly of electronic semiconductor components with an energy storage unit can thus also continue to emit electromagnetic radiation for a limited time if an alternating electromagnetic field is no longer present. In particular, the integrated circuit can keep the energy storage unit at a constant voltage by virtue of the integrated circuit regulating the charging current provided by the resonant circuit for the energy storage unit by means of the selection of the coupling factor.

In accordance with at least one embodiment of the assembly of electronic semiconductor components, at least three optoelectronic semiconductor components are driven by means of the integrated circuit, wherein each optoelectronic semiconductor component is configured for emitting electromagnetic radiation having a different wavelength. In particular, the group of three optoelectronic semiconductor components can be configured for emitting electromagnetic radiation in a red, a green and a blue wavelength range. By way of example, a colored mixed radiation can be emitted by such a group of optoelectronic semiconductor components.

A method for operating an assembly of electronic semiconductor components is further specified. In particular, an assembly of electronic semiconductor components described here can be operated by the method. That is to say that all features described for the assembly of electronic semiconductor components are also disclosed for the method for operating an assembly of electronic semiconductor components, and vice versa.

In accordance with at least one embodiment of the method for operating an assembly of optoelectronic semiconductor components, the assembly comprises at least one optoelectronic semiconductor component, a varactor component and a receiving element, wherein the optoelectronic semiconductor component has an active region configured for emitting electromagnetic radiation and the varactor component together with the receiving element forms a tunable resonant circuit. By means of the resonant circuit, energy is drawn from an alternating electromagnetic field with which the optoelectronic semiconductor component is operated.

In accordance with at least one embodiment of the method for operating an assembly of electronic semiconductor components, a receiver frequency is assigned to the resonant circuit, said receiver frequency being set to a predefined value by means of the varactor component. The resonant circuit can be tuned to a desired receiver frequency by means of the varactor component. The receiver frequency corresponds to the resonant frequency of the resonant circuit. In particular, the desired capacitance of the varactor component can be set by means of a DC voltage present at the varactor component.

In accordance with at least one embodiment of the method for operating an assembly of electronic semiconductor components, the assembly comprises an integrated circuit, which controls or regulates the receiver frequency by means of a control voltage at the varactor component. In particular, the control voltage is a DC voltage. In this case, the integrated circuit outputs the control voltage, which is present for example directly at the varactor component. The receiver frequency of the resonant circuit and as a result also the coupling factor of the resonant circuit to an alternating electromagnetic field arise by means of the set capacitance of the varactor component.

In accordance with at least one embodiment of the method for operating an assembly of electronic semiconductor components, the integrated circuit controls or regulates the receiver frequency depending on the energy drawn from the alternating electromagnetic field. The coupling factor of the resonant circuit with the alternating field can be set by way of the receiver frequency. The adjustable coupling factor enables an adjustable power consumption of the resonant circuit. By way of example, the integrated circuit thus controls or regulates the power consumption according to a power required for operating the optoelectronic semiconductor components.

In accordance with at least one embodiment of the method for operating an assembly of electronic semiconductor components, the integrated circuit communicates with a transmitting element by way of a modulation of the control voltage. The change in the control voltage results in a variation of the capacitance of the varactor component, as a result of which the receiver frequency of the resonant circuit changes. An altered receiver frequency brings about an altered power consumption of the resonant circuit from the transmission field. This variation of the power consumption can be detected at the transmitting element. The integrated circuit can communicate with the transmitting element by means of this modulated signal. The communication can also be effected in the opposite direction, for example, by the transmitting element modulating its frequency.

Further advantages and advantageous configurations and developments of the assembly of electronic semiconductor components will become apparent from the following exemplary embodiments, in association with those illustrated in the figures.

Figure 2:
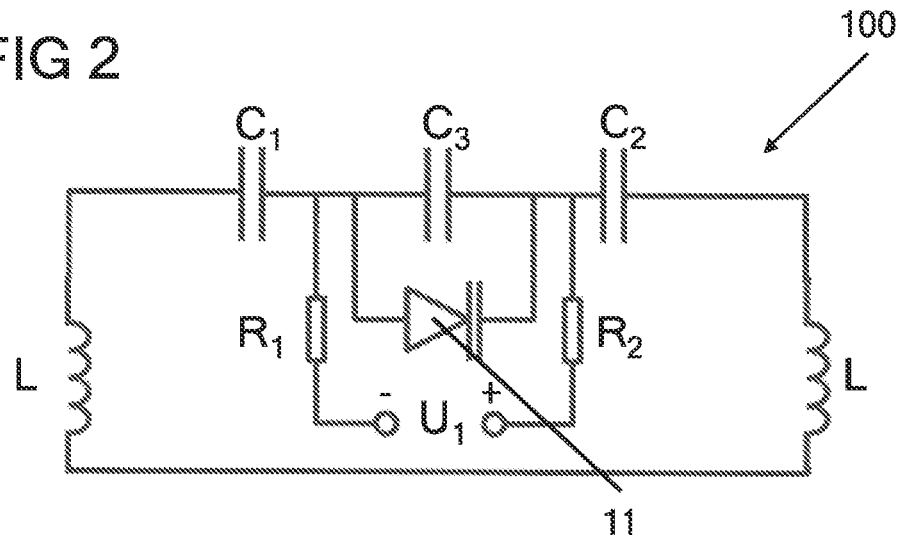
Figure 3:
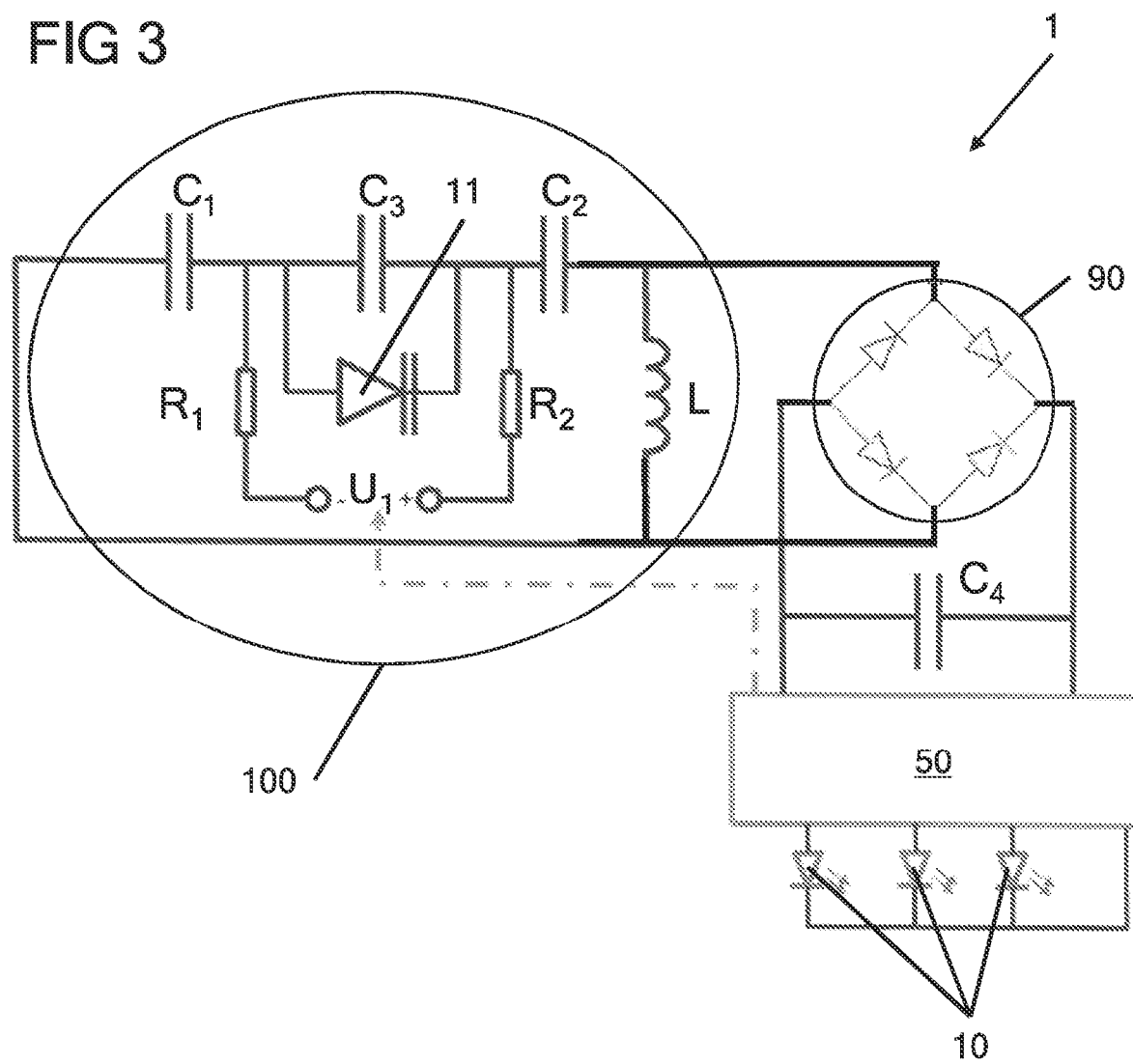

In the figures:

FIG. 1 shows a schematic sectional view of an assembly of electronic semiconductor components described here in accordance with a first exemplary embodiment, FIG. 2 shows a circuit diagram of a resonant circuit described here, and FIG. 3 shows a circuit diagram of an assembly of electronic semiconductor components described here in accordance with a second exemplary embodiment.

Elements that are identical, of identical type or act identically are provided with the same reference signs in the figures. The figures and the size relationships of the elements illustrated in the figures among one another should not be regarded as to scale. Rather, individual elements may be illustrated with an exaggerated size in order to enable better illustration and/or in order to afford a better understanding.

FIG. 1 shows a schematic sectional view of an assembly of electronic semiconductor components 1 described here in accordance with a first exemplary embodiment. The assembly of electronic semiconductor components 1 comprises a plurality of optoelectronic semiconductor components 10 arranged on a carrier 20 in a manner spaced apart laterally in a common plane. The carrier 20 comprises a first side 20A, on which the optoelectronic semiconductor components 10 are arranged, and a second side 20B, which is situated opposite the first side 20A and on which a receiving element 30 is arranged.

The optoelectronic semiconductor components 10 are configured for emitting electromagnetic radiation, for example blue light. In particular, the optoelectronic semiconductor components 10 comprise different optoelectronic semiconductor components configured in each case for emitting electromagnetic radiation having a different wavelength. By way of example, it is thus possible to emit a white mixed radiation or a mixed radiation having a further desired color. Furthermore, a varactor component 11 is situated on the first side 20A of the carrier 20. Furthermore, the assembly of electronic semiconductor components 1 comprises a receiving element 30 arranged on the second side 20B of the carrier. The receiving element 30 comprises a plurality of coils 300 having one turn and is configured for drawing electromagnetic energy from an alternating electromagnetic field.

The receiving element 30 with the varactor component 11 forms a resonant circuit 100, which serves to supply the optoelectronic semiconductor components 10 with electrical energy. The resonant frequency of the resonant circuit 100 is embodied such that it is variable by means of the adjustable capacitance of the varactor component 11.

The carrier 20 is a printed circuit board and contributes to the mechanical stabilization of the assembly of electronic semiconductor components 1. The coils 300 are realized as individual circular conductor tracks in the carrier 20. The carrier 20 has a multilayered layer structure accommodating the individual turns of the coils 300. The coils 300 are connected to one another at one point by means of through contacts, for example, and can thus jointly form a single inductance.

FIG. 2 shows a circuit diagram of a resonant circuit 100 described here. The resonant circuit 100 comprises an inductance L, two coupling capacitors C1 and C2 and a capacitance C3. The capacitance C3 is connected in parallel with the varactor component 11. The coupling capacitors C1 and C2 serve for decoupling the control voltage U1 applied to the varactor component 11. The varactor component 11 is connected to a voltage supply by means of the resistors R1 and R2 and can be raised to a different voltage potential by means of a variable control voltage, as a result of which the capacitance of the varactor component 11 changes.

The resonant circuit 100 constructed in this way has a tunable resonant frequency that can vary depending on the capacitance of the varactor component 11. Advantageously, mechanically movable parts, such as a trimming capacitor, for example, can be dispensed with in this embodiment of a tunable resonant circuit.

FIG. 3 shows a circuit diagram of an assembly of electronic semiconductor components 1 described here in accordance with a second exemplary embodiment. The assembly of electronic semiconductor components 1 comprises a resonant circuit 100, in accordance with the exemplary embodiment shown in FIG. 2. Furthermore, the assembly comprises a rectifier circuit 90, an energy storage unit C4 and an integrated circuit 50. The rectifier circuit 90 comprises four individual diodes and converts an AC voltage entering from the resonant circuit into a DC voltage. The DC voltage supplies the energy storage unit C4 and the integrated circuit 50 with a supply voltage. The integrated circuit operates three optoelectronic semiconductor components 10.

The energy storage unit C4 is for example a capacitance or a rechargeable battery. The integrated circuit 50 can forward a control voltage U1 to the varactor component 11 and thus alter the receiver frequency of the resonant circuit 100. By way of example, the integrated circuit 50 outputs a control voltage U1 depending on the electrical power required by it for supplying the optoelectronic semiconductor components 10. By way of example, the resonant circuit 100 can thus have a higher coupling factor with respect to an alternating electromagnetic field in the case where the optoelectronic semiconductor components 10 are in the switched-on state compared with the case of switched-off optoelectronic semiconductor components 10. In this regard, the energy provided by the alternating electromagnetic field can be utilized efficiently.

The optoelectronic semiconductor components 10 are configured for emitting electromagnetic radiation having different wavelengths. One optoelectronic semiconductor component 10 in each case is configured for emitting electromagnetic radiation in a red, a green and a blue wavelength range. Via the integrated circuit 50, for example, wireless communication with a further terminal can be realized by means of Bluetooth or Zigbee. By way of example, the optoelectronic semiconductor components 10 can thus be switched on or off or a specific mixed radiation of the emission of the optoelectronic semiconductor components 10 can be set.

In a further embodiment, by way of example, the rectifier circuit 90, the coupling capacitors C1, C2 and also the varactor component 11 can already be integrated in the integrated circuit 50.

The invention is not restricted by the description on the basis of the exemplary embodiments. Rather, the invention encompasses any novel feature and also any combination of features, which in particular includes any combination of features in patent claims, even if this feature or this combination itself is not explicitly specified in the patent claims or exemplary embodiments.

LIST OF REFERENCE SIGNS

1 Assembly of electronic semiconductor components
10 Optoelectronic semiconductor component
11 Varactor component
20 Carrier
20A First side
20B Second side
30 Receiving element
50 Integrated circuit
90 Rectifier circuit
100 Resonant circuit
300 Coil
C1 Coupling capacitor
C2 Coupling capacitor
C3 Capacitance
C4 Energy storage unit
R1 Resistor
R2 Resistor
U1 Control voltage
L Inductance

The invention claimed is:

1. An assembly of electronic semiconductor components comprising
a carrier,
at least one optoelectronic semiconductor component, a varactor component and a receiving element, wherein
the optoelectronic semiconductor component, the varactor component and the receiving element are arranged on the carrier,
the optoelectronic semiconductor component and the varactor component are formed with the same semiconductor material,
the optoelectronic semiconductor component has an active region configured for emitting electromagnetic radiation,
the varactor component together with the receiving element forms a tunable resonant circuit,
the varactor component is configured to set a receiver frequency of the resonant circuit, and
the resonant circuit is configured to draw energy for operating the optoelectronic semiconductor component from an alternating electromagnetic field.

2. The assembly of electronic semiconductor components as claimed in claim 1, wherein
the optoelectronic semiconductor component and the varactor component are arranged on a first side of the carrier, and
the receiving element is arranged on a second side of the carrier, said second side being situated opposite the first side.

3. The assembly of electronic semiconductor components as claimed in claim 1, wherein the receiving element comprises a coil having at least one turn.

4. The assembly of electronic semiconductor components as claimed in claim 1, which comprises an integrated circuit having an interface for wireless communication.

5. The assembly of electronic semiconductor components as claimed in claim 4, wherein at least three optoelectronic semiconductor components are driven by means of the integrated circuit, wherein each optoelectronic semiconductor component is configured for emitting electromagnetic radiation having a different wavelength.

6. The assembly of electronic semiconductor components as claimed in claim 1, which has an electrical energy storage unit between the resonant circuit and the integrated circuit.

7. A method for operating an assembly of electronic semiconductor components comprising
at least one optoelectronic semiconductor component, a varactor component and a receiving element, wherein
the optoelectronic semiconductor component has an active region configured for emitting electromagnetic radiation,
the optoelectronic semiconductor component and the varactor component are formed with the same semiconductor material,
the varactor component together with the receiving element forms a tunable resonant circuit,
the resonant circuit draws energy from an alternating electromagnetic field with which the optoelectronic semiconductor component is operated, and
a receiver frequency is assigned to the resonant circuit, said receiver frequency being set to a predefined value by means of the varactor component.

8. The method for operating an assembly of electronic semiconductor components as claimed in claim 7, wherein the assembly comprises an integrated circuit, which controls or regulates the receiver frequency by means of a control voltage at the varactor component.

9. The method for operating an assembly of electronic semiconductor components as claimed in claim 7, wherein the integrated circuit controls or regulates the receiver frequency depending on the energy drawn from the alternating electromagnetic field.

* * * * *